United States Patent [19]

Tsang

[11] Patent Number: 4,464,342

[45] Date of Patent: Aug. 7, 1984

[54] MOLECULAR BEAM EPITAXY APPARATUS FOR HANDLING PHOSPHORUS

[75] Inventor: Won-Tien Tsang, New Providence, N.J.

[73] Assignee: AT&T Bell Laboratories, Murray Hill, N.J.

[21] Appl. No.: 378,281

[22] Filed: May 14, 1982

[51] Int. Cl.$^3$ ............................................. C30B 35/00
[52] U.S. Cl. .................................. 422/247; 422/254; 156/DIG. 103; 156/DIG. 70; 148/175; 118/719; 118/724; 118/729; 118/733
[58] Field of Search ........................ 422/245, 247, 254; 156/610, 614, DIG. 70, DIG. 103; 118/719, 724, 726, 733, 729; 219/121 EN, 121 EZ, 121 PT, 121 PV; 250/492.2; 148/175

[56] References Cited

U.S. PATENT DOCUMENTS

| | | | |
|---|---|---|---|
| 3,213,825 | 10/1965 | Copper et al. | 118/724 |
| 4,181,544 | 1/1980 | Cho | 156/614 |
| 4,220,488 | 9/1980 | Duchemin et al. | 156/614 |
| 4,330,360 | 5/1982 | Kubiak et al. | 422/245 |
| 4,338,883 | 7/1982 | Mahler | 118/719 |

OTHER PUBLICATIONS

D. L. Smith and V. Y. Pickhardt, Molecular Beam Epitaxy of II–VI Compounds, Jun., 1975, Journal of Applied Physics, vol. 46, No. 6, pp. 2366–2374.

*Primary Examiner*—David L. Lacey
*Attorney, Agent, or Firm*—Richard D. Laumann

[57] ABSTRACT

Molecular beam epitaxy apparatus that permits a cryo-panel on which high vapor pressure material has condensed to be removed from the growth chamber to an outgassing chamber permits the high vapor pressure material, such as phosphorus, to be easily used in growing compound semiconductor materials is described. The apparatus has an evacuable first chamber with a plurality of effusion ovens and an evacuable second chamber with a valve connecting the chambers. The apparatus further comprises apparatus for moving a cryo-panel between the first and second chambers and apparatus for heating the cryo-panel in the second chamber.

6 Claims, 5 Drawing Figures

MOLECULAR BEAM EPITAXY APPARATUS FOR HANDLING PHOSPHORUS

TECHNICAL FIELD

This invention relates generally to molecular beam epitaxy and particularly to molecular beam epitaxy involving compounds containing high vapor pressure elements such as phosphorus.

BACKGROUND OF THE INVENTION

The preparation of high quality semiconductor materials, that is, materials having a high degree of crystal perfection and desired compositional variations, is important in present day technology, and a variety of techniques has been developed to prepare such materials for use in devices such as integrated circuits, photodetectors, injection lasers, microwave oscillators, etc. For example, liquid phase epitaxy (LPE), chemical vapor deposition (CVD) and molecular beam epitaxy (MBE) have been used to prepare device quality semiconductor materials.

The last named technique is very successful and has been an important approach in the successful effort to grow high quality $Al_xGa_{1-x}As$, x being greater than or equal to 0.0 and less than or equal to 1.0, multilayer structures for use in applications such as optoelectronic and microwave devices. It is believed by some workers in the art that MBE will become the preferred crystal growth technology for the Group III-V $Al_xGa_{1-x}As$ materials system.

This optimistic assessment regarding the future of MBE is based on several factors and recent important advances. For example, large area, approximately 7.5 cm diameter, highly uniform AlGaAs double-heterostructure wafers which yielded laser diodes having both very low current threshold and good lifetime characteristics have been grown. Additionally, development of both ohmic contact and Schottky barrier structures as well as metallizations have been accomplished. Furthermore, certain types of devices are presently most expeditiously fabricated by MBE. These devices include high mobility modulation-doped semiconductor superlattices for field effect transistors, superlattices comprising ultra-thin alternating GaAs and AlAs layers, other structures having ultra-thin layers, and AlGaAs multilayers which have been grown at accelerated growth rates of approximately 12 $\mu$m/h. All of these factors and advances suggest that MBE has great promise as a high through-put, high yield, and a highly reproducible method of fabricating AlGaAs multilayer structures for optoelectronic and microwave devices as well as integrated circuits. Successful work has also been done growing devices having other Group III-V, such as AlGaAsSb and InGaAs, layers by MBE.

It is now well known that the Group III-V quaternary InGaAsP materials system is important for optical fiber communications operating in the wavelength range between 1.0 and 1.65 $\mu$m where the present silica-based glass fibers have low loss and dispersion. The InGaAsP materials, which are typically grown lattice-matched to an InP substrate, are used for both light sources, such as lasers and light emitting diodes, and photodetectors. This materials system may also find applications in microwave electronics and integrated optoelectronics. For microwave electronics, the InGaAsP materials have higher peak electron drift velocities than GaAs and Si, and also have better surface characteristics than GaAs. Such properties are important and desirable in both FETs and transfer electron devices. Additionally, a combination of the photonic and electronic devices fabricated with InGaAsP on the same InP substrate could well be the ultimate accomplishment of integrated optoelectronics.

At present, however, these Group III-V InGaAsP quaternary materials systems are prepared almost exclusively by liquid phase epitaxy because these materials have not yet been grown successfully by MBE due to several difficulties associated with the growth of phosphorus-containing compounds. For example, phosphorus has a very high vapor pressure and is highly reactive with several metals, such as copper, that are commonly used in MBE apparatus as sealing gaskets. These and other difficulties make the regular ultra-high vacuum MBE systems used for growing the AlGaAs and the other materials previously mentioned unsuitable for use with InGaAsP for at least the following reasons.

For example, conventional MBE systems are evacuated by ion pumps that are relatively inefficient in pumping phosphorus. When the phosphorus pressure is greater than approximately $10^{-5}$ torr for an extended period of time, the ion pumps tend to become overloaded and to cease pumping. The difficulties involved in pumping phosphorus become even greater when phosphorus-containing compound semiconductors are being grown because the sticking coefficient of phosphorus on the substrate or epitaxial layer surface is relatively small. In fact, the sticking coefficient of phosphorus is even smaller than the relatively small sticking coefficient of As. Consequently, the phosphorus pressure within the growth chamber is typically much higher than the arsenic pressure commonly present within the growth chamber during growth of, for example, AlGaAs. The high phosphorus pressure unavoidably either overloads the ion pump or prevents the growth of epitaxial layers at high growth rates.

Extensive cryo-panels can be used to condense the background phosphorus and hence can help in keeping the background phosphorus pressure low during growth. However, this approach also suffers drawbacks. First, at the end of the growth run and during the subsequent warming of the cryo-panels, the phosphorus will reevaporate and the resulting increase in the phosphorus pressure in the chamber will overload the ion pump. Moreover, this problem is not easily avoided because other types of pumps cannot be easily substituted for ion pumps in MBE apparatus. The use of ion pumps is important for the growth of high quality epitaxial layers, because, unlike other commonly used pumps, for example, oil diffusion pumps, there are no hydrocarbon contaminants from the ion pumps in the vacuum chamber. Additionally, the use of ion pumps is desirable because such pumps are highly reliable and require virtually no maintenance. Second, when phosphorus condenses on the cool chamber walls or cryo-panels, it is in the form of white phosphorus. When this material is exposed to air, it is extremely likely that it will catch fire and form $P_2O_5$. This compound is hydroscopic and will then absorb water and form a gummy substance. This gummy substance contains phosphoric acid and will have deleterious effects on the MBE system. Consequently, if the phosphorus is not removed from the chamber before the chamber is exposed to air, it will not only contaminate the system with $P_2O_5$ but will also create a potentially dangerous situation.

SUMMARY OF THE INVENTION

I have found that semiconductor compounds comprising high vapor pressure elements, such as phosphorus, may be epitaxially grown in a molecular beam epitaxy apparatus comprising an evacuable first chamber having a plurality of effusion ovens and an evacuable second chamber and a valve intermediate said chambers. The apparatus further comprises a first and a second cryo-panel, means for moving at least one of said cryo-panels between said first and said second chambers and means for heating one of said cryo-panels in said second chamber. The first chamber is a growth chamber and the second chamber is an outgassing chamber.

The molecular beam epitaxy apparatus solves the problems described that have previously been encountered in growing semiconductor compounds comprising high vapor pressure elements such as phosphorus in such apparatus. In my system, ion pumps and cryo-panels, instead of the oil diffusion pumps, can be used and a low hydrocarbon environment is thus ensured in the growth chamber. With this apparatus, the growth chamber can be exposed to air without exposing the phosphorus coated cryo-panel to air.

BRIEF DESCRIPTION OF THE DRAWING

FIG. 5 is a sectional view of the first or growth chamber along line A—A in FIG. 1.

DETAILED DESCRIPTION

Figure 1:
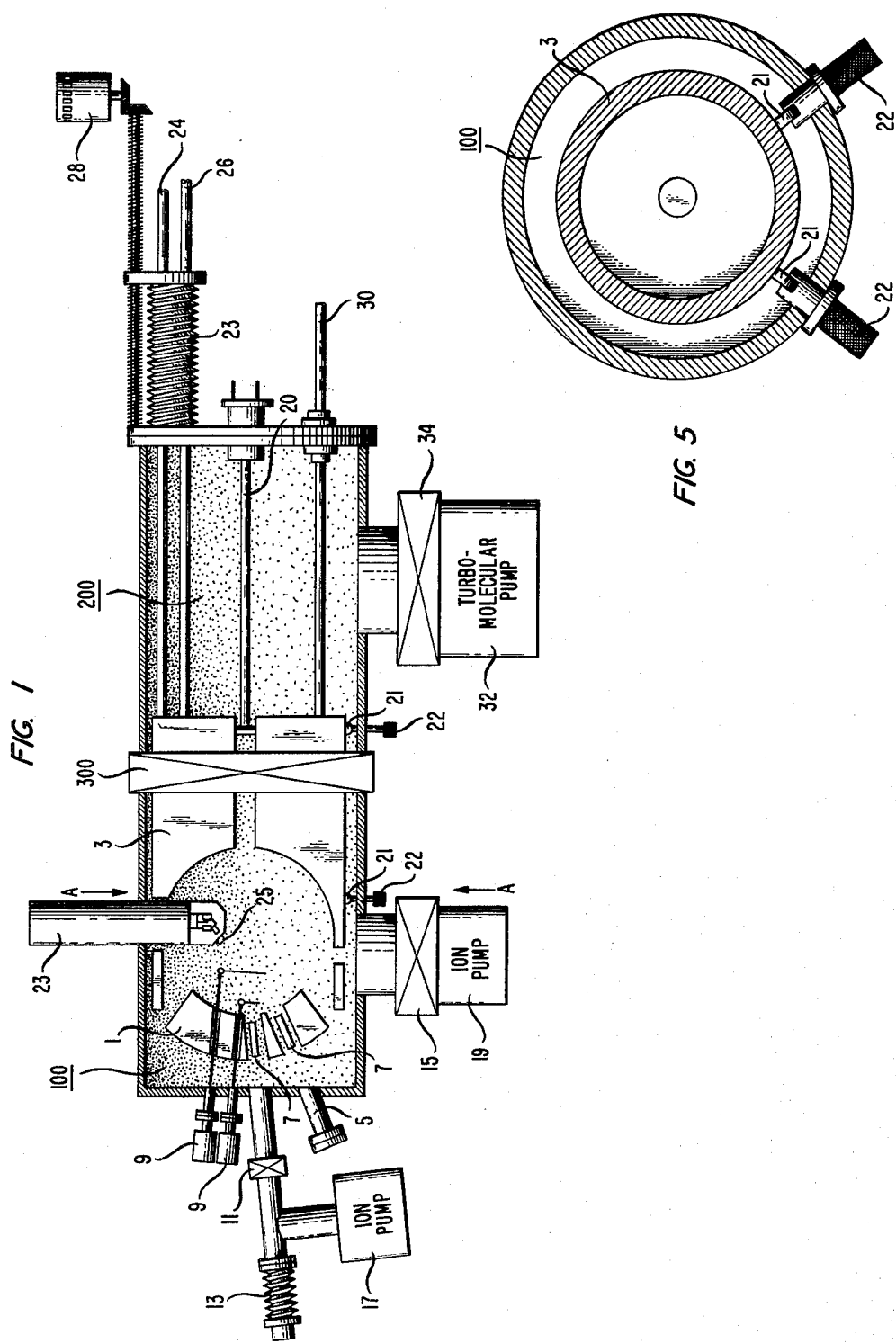
FIG. 1 is a sectional view of molecular beam epitaxy apparatus according to this invention.

A sectional view of one embodiment of the molecular beam epitaxy apparatus according to this invention is shown in FIG. 1. The elements depicted are not necessarily drawn to scale. The apparatus comprises a first or growth chamber indicated generally as 100 and a second or outgassing chamber indicated generally as 200. The growth chamber further comprises a first cryo-panel 1, a second cryo-panel 3, effusion oven port 5, effusion ovens 7, beam shutters and control mechanisms 9, valve 11, such as a gate valve, and source interlock 13. Communicating with growth chamber 100 through valves 11 and 15, in a manner suitable for pumping, are ion pump 17 and ion pump 19, respectively. Cryo-panel 3 rests on rollers which are indicated generally as 21 and are attached to coupling means 22 which are attached to the chamber walls. The growth chamber also has means 23 for putting a substrate into the growth chamber as well as for positioning and holding substrate 25 at the desired growth position.

The second or outgassing chamber 200 comprises a radiative heating element 20, extendable bellows 23, means 24 and means 26 for transporting a cryo-fluid to and from cryo-panel 3, means 28 for extending and contracting bellows 22, rod 30, and turbo-molecular pump 32. Valve 34 permits communication between chamber 200 and pump 32. Means 28 is any convenient device, such as a motor, that may be used to extend or contract the bellows. Rod 30 is connected to cryo-panel 3 and permits cryo-panel 3 to be moved easily as it rests on rollers 21. Other types of vacuum pumps that are capable of evacuating the high pressure element may be used. Chamber 100 and chamber 200 are separated by valve 300 which, when open, permits communication, as described below, between the growth and outgassing chambers.

Although cryo-panel 3 is depicted as being primarily in growth chamber 100, this is its position for growth and it can be moved between chambers 100 and 200 using, for example, rollers 21 and rod 30 when outgassing of the cryo-panel is desired. Other means could also be employed. Additionally, only two effusion cells and two shutters are depicted for reasons of clarity although it is to be understood that a greater number of ovens and shutters may be present depending on the semiconductor material being grown. Additionally, cryo-panel 3 may rest on means other than rollers which permit cryo-panel 3 to be moved. The effusion ovens 7 are connected to rods (not shown) which provide mechanical support and permit the effusion ovens to be removed from the chamber for recharging. The structure of the valves, bellows, necessary vacuum fittings, pumps, etc., present in the apparatus is well known to those working in the art and need not be discussed in detail.

Figure 2:
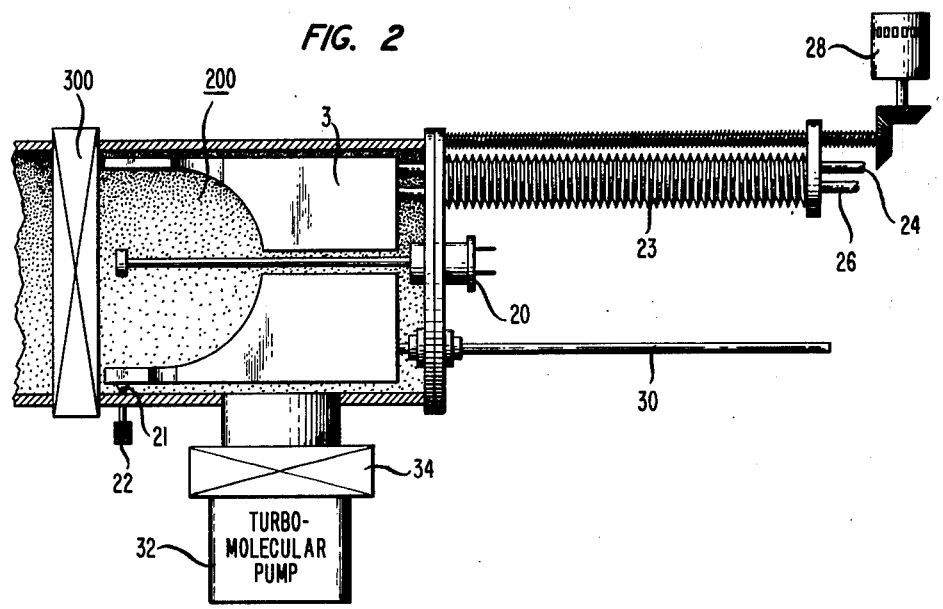
FIG. 2 is a sectional view of the second or outgassing chamber with one of the cryo-panels in the outgassing position.

Cryo-panel 3 is depicted in the outgassing position in chamber 200 in FIG. 2. During outgassing of cryo-panel 3, valve 300 between chamber 100 and chamber 200 is closed.

Figure 3:
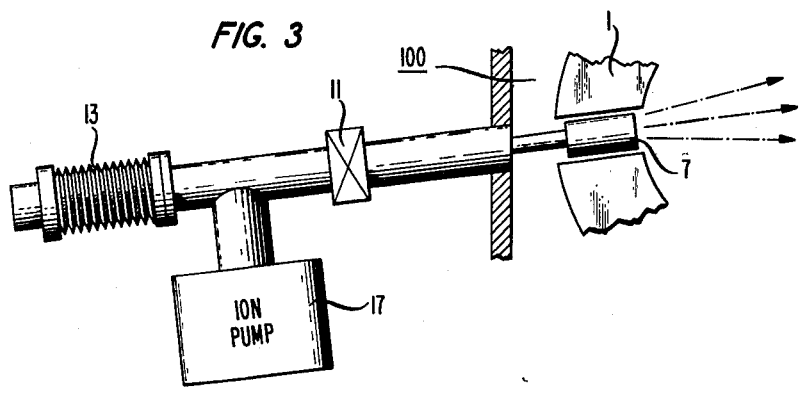
FIG. 3 is a sectional view of a portion of the first or growth chamber showing an oven in the growth position.

A sectional view of a portion of the growth chamber 100 is shown in FIG. 3 with effusion oven 7 in the growth position. The same portion of the growth chamber 100 is shown in a sectional view in FIG. 4 with effusion oven 7 having been retracted from chamber 100 and being in a position suitable for recharging the oven.

A sectional view of chamber 100 along line A—A of FIG. 1 is shown in FIG. 5. As can be seen, rollers 21 are positioned so that their surfaces are parallel to a tangent to cryo-panel 3 at the points of contact between the rollers and the cryo-panel.

A convenient method of operation of the apparatus depicted in FIGS. 1–5 will be briefly described. The effusion ovens are loaded with the desired semiconductor materials and the growth and outgassing chambers are evacuated to the desired pressure. Valve 300 is typically open. The effusion ovens 7 are then heated, by well-known means (not shown), to the desired individual temperatures and the beam shutters 9 are opened permitting the beams from the ovens to impinge on substrate 25 which has been positioned in the growth chamber at the desired position. Cryo-panels 1 and 3, which are cooled by a cryo-fluid, such as, for example, liquid nitrogen, essentially completely surround the substrate during growth. Consequently, any phosphorus that does not stick to the substrate will condense primarily on the cryo-panels. This condensation, which is generally termed cryo-pumping, ensures a low phosphorus background pressure and permits a high phosphorus flux at the substrate surface thus enabling a high growth rate to be obtained. Since the cryo-panels essentially completely surround the substrate, little phosphorus escapes from the volume enclosed by the cryo-panels and condenses on the growth chamber walls. Furthermore, the cryo-panel structures ensure that ion pump 15 will not be overloaded by excessive phosphorus.

When the growth of the desired epitaxial layers has been completed, the cryo-panel 1, which contains the heated source ovens, is allowed to either warm up or is heated up by, for example, maintaining the effusion ovens at an elevated temperature or by passing a hot liquid or air through the panel. The phosphorus that condensed on cryo-panel 1 reevaporates and condenses onto cryo-panel 3, which is still maintained at a low temperature. After this process, cryo-panel 3 is moved completely into outgassing chamber 200 by means of rod 30 and rollers 21, and valve 300 closed.

Cryo-panel 3 is now in the outgassing position in chamber 200 as shown in FIG. 2. Cryo-panel 3 is now radiatively heated to a temperature of approximately 300° C. by means of the heating elements 20 that are now positioned in the interior of the cryo-panel. Additionally, the wall of the outgassing chamber may also be heated up to approximately 300° C. A temperature of approximately 300° C. is desirable because this temperature will vaporize the phosphorus. Other temperatures will be used to remove other elements. These temperatures will be selected in well-known manner. The phosphorus condensed on the walls of the cryo-panel vaporizes and is removed from the chamber by means of the turbo-molecular pump 32. A turbo-molecular pump is desirably used because it has less hydrocarbon contamination than does an oil diffusion pump. Other types of pumps suitable for evacuating phosphorus may also be used. After the phosphorus has been outgassed from cryo-panel 3, isolation valve 300 may be opened and cryo-panel 3 again cooled with a cryo-fluid and introduced into growth chamber 100. Turbo-molecular pump 32 can then be valved off, i.e., valve 34 may be closed, if desired. Thus, the phosphorus is cleanly removed from the growth chamber and the turbo-molecular pump is used only during the outgassing period. Outgassing may be infrequent and both the possibility and amount of hydrocarbon contaminants in the growth chamber are thus minimized.

Furthermore, in a preferred embodiment, cryo-panel 3 is made to closely fit the opening of the isolation gate valve 300, i.e., the spacing is less than about 1 mm, and further extends, as shown in FIG. 1, across said valve into chamber 200 when cryo-panel 3 is in the growth position. This embodiment has at least two important advantages over an embodiment in which cryo-panel 3 is confined to chamber 100. First, the close fit between the cryo-panel and the gate valve opening reduces the conductance of materials between the growth chamber and the outgassing chamber and thus minimizes possible contamination from the outgassing chamber. Second, the cryo-panel is both cooled by liquid nitrogen during the growth process and extends across the valve, and as a result, any materials, such as water or any other gas, that outgas from the valve itself, are condensed immediately on the cryo-panel.

While the system is especially advantageously used with phosphorus, it possesses advantages over presently used molecular beam epitaxy systems when used to fabricate nonphosphorus-containing semiconductor compounds. For example, after a period of molecular beam epitaxy growth, the cryo-panel 3 will be coated with other elements, such as As, In, Ga, Al, etc., which are commonly used in the epitaxial growth process. Consequently, the effective surface area of the cryo-panel increases significantly and such surfaces, when exposed to air, absorb large amounts of $H_2O$ and $N_2$ as well as other gasses. The absorbed gasses result in prolonged periods of outgassing after the system is closed and evacuated. The resulting high level of residual gasses is undesirable for growing high quality materials by molecular beam epitaxy as deleterious impurities may be incorporated into the materials. In the conventional MBE system, the cryo-panels are typically exposed to air during the period of source recharge. With my apparatus, cryo-panel 3 may be retreated into outgassing chamber 200 and isolation valve 300 closed during source recharge.

In the embodiment described, cryo-panel 1 is usually clean as described above as the beam fluxes are not incident on its surfaces. This apparatus thus ensures fast pump-down of the growth chamber as well as a reduced $H_2O$ level after open-up for recharge of ovens.

After prolonged periods of growth, the condensed materials may begin to peel off the cryo-panel. At this time, it is desirable to either partially or completely clean the cryo-panel 3. Partial cleaning requires scraping off the peelings and complete cleaning requires various chemical solvent cleanings. In both cases, cryo-panel 3 is exposed to air and it is also exposed to various chemicals in the latter case. In the conventional system, outgassing continues for long periods of time, especially when chemical cleaning is used. This increases both the down-time of the system and the risk of a high degree of contamination of the materials grown. Apparatus according to this invention permits the cleaned cryo-panel to be pre-outgassed at a higher temperature, approximately 300° C., in the outgassing chamber which is pumped out by the turbo-molecular pump. After the high temperature outgassing, the cryo-panel is sufficiently clean to be introduced into the growth chamber. This method therefore reduces the possibility of contaminating the growth chamber. It is apparent that these two advantages are important even for those molecular beam epitaxy systems that are not to be used for growing compound semiconductors containing phosphorus.

Figure 4:
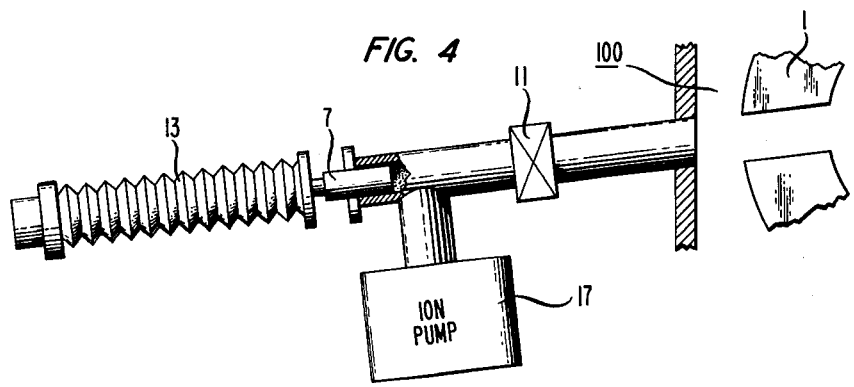
FIG. 4 is a sectional view of a portion of the first or growth chamber showing an oven in recharge position.

When phosphorus-containing compound semiconductors are grown, a high phosphorus flux is needed during growth because of the relatively low sticking coefficient of phosphorus. As a result, the phosphorus charge in the effusion oven depletes more rapidly than do the charges for other elements such as Al, Ga, In, and even As which also does not deplete as rapidly as phosphorus. The source recharge interlock depicted in FIGS. 3 and 4 is well suited for high vapor pressure material, such as phosphorus and arsenic. FIGS. 3 and 4 show the growth and recharge positions, respectively, of the oven. In the recharge position, the oven is retreated beyond the gate valve 11 and the valve is closed. The interlock is then opened and the oven is recharged after opening. The interlock is then closed and pump 19 evacuates the volume to low pressure. Finally, the gate valve is reopened and the oven reintroduced into the growth position. The use of the phosphorus and arsenic recharge interlock prolongs the time that the growth chamber is under ultra-high vacuum. This, together with a retreatable cryo-panel design, ensures an ultra-clean growth environment for molecular beam epitaxy growth.

Modifications are contemplated and will be readily apparent to those skilled in the art. For example, because cryo-panel 3 needs only infrequent outgassing, it is possible that a cold-trapped diffusion pump can be used in place of the turbo-molecular pump.

What is claimed is:

1. A molecular beam epitaxy apparatus comprising an evacuable first chamber having a plurality of effusion ovens, an evacuable second chamber, said second chamber being an outgassing chamber, a valve connecting said first and said second chambers, a pump for removing material from said second chamber, and a cryo-panel, said cryo-panel being capable of being moved between said first chamber and said second chamber through said valve; for moving said cryo-panel between said first chamber and said second chamber; means for heating said cryo-panel in said second chamber.

2. Apparatus as recited in claim 1 in which said first chamber further comprises another cryo-panel.

3. Apparatus as recited in claim 1 or 2 in which said first chamber further comprises an oven recharge interlock comprising a third chamber, a valve connecting said first chamber and said third chamber; means for moving at least one of said ovens between said first chamber and said third chamber.

4. Apparatus as recited in claim 3 in which said first recited cryo-panel extends into said outgassing chamber when said first recited cryo-panel is in the growth position.

5. Apparatus as recited in claim 4 in which said means for moving comprises a rod attached to said first recited cryo-panel.

6. Apparatus as recited in claim 5 in which said means for moving further comprises rollers, said first recited cryo-panel being positioned and arranged to move on said rollers.

* * * * *

UNITED STATES PATENT AND TRADEMARK OFFICE
CERTIFICATE OF CORRECTION

PATENT NO. : 4,464,342

DATED : August 7, 1984

INVENTOR(S) : Won-Tien Tsang

It is certified that error appears in the above-identified patent and that said Letters Patent is hereby corrected as shown below:

Column 7, line 9, after "valve;" --means-- should be inserted.

Signed and Sealed this

Thirty-first Day of March, 1987

Attest:

DONALD J. QUIGG

Attesting Officer    Commissioner of Patents and Trademarks